US010014977B2

(12) United States Patent
Driessen et al.

(10) Patent No.: US 10,014,977 B2
(45) Date of Patent: Jul. 3, 2018

(54) SYSTEMS AND METHODS FOR TRANSMITTING DATA

(71) Applicant: AT&T Intellectual Property II, L.P., Atlanta, GA (US)

(72) Inventors: Peter Frank Driessen, Highlands, NJ (US); Mathias R. Kretschmer, Bedminster, NJ (US); Schuyler Reynier Quackenbush, Westfield, NJ (US); James H. Snyder, North Plainfield, NJ (US)

(73) Assignee: AT&T Intellectual Property II, L.P., Atlanta, GA (US)

( * ) Notice: Subject to any disclaimer, the term of this patent is extended or adjusted under 35 U.S.C. 154(b) by 267 days.

(21) Appl. No.: 14/860,134

(22) Filed: Sep. 21, 2015

(65) Prior Publication Data

US 2016/0013886 A1 Jan. 14, 2016

Related U.S. Application Data

(63) Continuation of application No. 13/851,224, filed on Mar. 27, 2013, now Pat. No. 9,160,495, which is a
(Continued)

(51) Int. Cl.
*H04B 7/24* (2006.01)
*H04B 15/00* (2006.01)
(Continued)

(52) U.S. Cl.
CPC .......... *H04L 1/0041* (2013.01); *G06F 11/10* (2013.01); *H03M 13/356* (2013.01);
(Continued)

(58) Field of Classification Search
USPC ....... 375/219, 220, 221, 222, 229–236, 316, 375/211, 240.26–240.28, 285, 284, 295,
(Continued)

(56) References Cited

U.S. PATENT DOCUMENTS 4,866,701 A 9/1989 Giacopelli et al.
5,671,156 A 9/1997 Weerackody et al.
(Continued)

OTHER PUBLICATIONS

United States Patent and Trademark Office, "Non-Final Office Action", issued in connection with U.S. Appl. No. 13/851,224, dated Sep. 24, 2014 (12 pages).
(Continued)

*Primary Examiner* — Linda Wong
(74) *Attorney, Agent, or Firm* — Hanley, Flight and Zimmerman, LLC

(57) ABSTRACT

A system and method for transmitting data over a channel, in which the data are categorized in at least two different categories. For example, the data are categorized according to the effect on perceived degradation on the data when error mitigation is performed on the data. Corrupted data of the first category are replaced using a first replacement method, such as retransmission and forward error correction. The corrupted data of the second category are replaced using a second replacement method different from the first replacement method, e.g., error mitigation or interpolation.

14 Claims, 7 Drawing Sheets

Related U.S. Application Data continuation of application No. 11/240,170, filed on Sep. 30, 2005, now Pat. No. 8,428,185, which is a continuation of application No. 10/851,581, filed on May 21, 2004, now Pat. No. 7,042,933, which is a continuation of application No. 09/604,690, filed on Jun. 28, 2000, now Pat. No. 6,850,559.

(60) Provisional application No. 60/141,321, filed on Jun. 28, 1999.

(51) Int. Cl.
| | |
|---|---|
| *H04L 1/00* | (2006.01) |
| *H03M 13/35* | (2006.01) |
| *G06F 11/10* | (2006.01) |
| *H03M 13/00* | (2006.01) |
| *H04L 1/18* | (2006.01) |

(52) U.S. Cl.
CPC ...... *H03M 13/6508* (2013.01); *H04L 1/0017* (2013.01); *H04L 1/0045* (2013.01); *H04L 1/1829* (2013.01); *H04L 1/18* (2013.01); *H04L 2001/0098* (2013.01)

(58) Field of Classification Search
USPC ........ 375/296, 297, 346, 347, 350; 370/310, 370/441, 345; 455/39, 501, 515, 517, 455/63.1, 67.13, 130, 185.1, 226.3, 226.2, 455/226.1
See application file for complete search history.

(56) References Cited

U.S. PATENT DOCUMENTS

| | | | |
|---|---|---|---|
| 5,680,508 A | 10/1997 | Liu | |
| 5,751,773 A | 5/1998 | Campana, Jr. | |
| 5,768,291 A | 6/1998 | Kelton et al. | |
| 5,781,888 A | 7/1998 | Herre | |
| 5,802,076 A | 9/1998 | Weigand et al. | |
| 5,870,412 A | 2/1999 | Schuster et al. | |
| 5,917,835 A | 6/1999 | Barrett et al. | |
| 5,923,642 A | 7/1999 | Young | |
| 5,968,197 A * | 10/1999 | Doiron .................... | H04L 1/188 714/748 |
| 6,085,252 A | 7/2000 | Zhu et al. | |
| 6,161,210 A * | 12/2000 | Chen ................. | H03M 13/4115 375/262 |
| 6,192,087 B1 | 2/2001 | Olafsson et al. | |
| 6,233,251 B1 | 5/2001 | Kurobe et al. | |
| 6,272,660 B1 * | 8/2001 | Chen .................... | H03M 13/09 714/794 |
| 6,275,966 B1 | 9/2001 | Sitterley | |
| 6,289,297 B1 | 9/2001 | Bahl | |
| 6,317,430 B1 * | 11/2001 | Knisely ................. | H04L 1/0007 370/394 |
| 6,338,105 B1 * | 1/2002 | Niizuma ............... | H04L 7/0008 710/72 |
| 6,363,425 B1 | 3/2002 | Hook et al. | |
| 6,405,338 B1 | 6/2002 | Sinha et al. | |
| 6,498,936 B1 | 12/2002 | Raith | |
| 6,646,987 B1 | 11/2003 | Qaddoura | |
| 6,711,128 B1 | 3/2004 | Ramakrishnan | |
| 6,731,602 B1 * | 5/2004 | Watanabe ............. | H04L 1/1887 370/231 |
| 6,775,652 B1 | 8/2004 | Cox et al. | |
| 6,850,559 B1 | 2/2005 | Driessen et al. | |
| 7,042,933 B2 | 5/2006 | Driessen et al. | |
| 8,428,185 B1 | 4/2013 | Driessen et al. | |
| 2001/0049804 A1 * | 12/2001 | Arai .................. | H03M 13/2909 714/712 |
| 2013/0229908 A1 | 9/2013 | Driessen et al. | |

OTHER PUBLICATIONS

United States Patent and Trademark Office, Notice of Allowance, issued in connection with U.S. Appl. No. 13/851,224, dated May 20, 2015 (15 pages).

United States Patent and Trademark Office, "Non-Final Office Action", issued in connection with U.S. Appl. No. 11/240,170 dated Jan. 9, 2008 (17 pages).

United States Patent and Trademark Office, "Final Office Action", issued in connection with U.S. Appl. No. 11/240,170 dated Sep. 17, 2008 (8 pages).

United States Patent and Trademark Office, "Advisory Action", issued in connection with U.S. Appl. No. 11/240,170 dated Jan. 22, 2009 (7 pages).

United States Patent and Trademark Office, "Non-Final Office Action", issued in connection with U.S. Appl. No. 11/240,170 dated Mar. 4, 2009 (7 pages).

United States Patent and Trademark Office, "Non-Final Office Action", issued in connection with U.S. Appl. No. 11/240,170 dated Sep. 14, 2009 (7 pages).

United States Patent and Trademark Office, "Final Office Action", issued in connection with U.S. Appl. No. 11/240,170 dated Apr. 18, 2011 (8 pages).

United States Patent and Trademark Office, "Non-Final Office Action", issued in connection with U.S. Appl. No. 11/240,170 dated Sep. 27, 2011 (11 pages).

United States Patent and Trademark Office, "Final Office Action", issued in connection with U.S. Appl. No. 11/240,170 dated Mar. 2, 2012 (13 pages).

United States Patent and Trademark Office, "Notice of Allowance", issued in connection with U.S. Appl. No. 11/240,170 dated Dec. 27, 2012 (9 pages).

United States Patent and Trademark Office, "Notice of Allowance", issued in connection with U.S. Appl. No. 11/240,170 dated Jan. 11, 2013 (8 pages).

\* cited by examiner

SYSTEMS AND METHODS FOR TRANSMITTING DATA

RELATED APPLICATIONS

This patent arises from a continuation of U.S. application Ser. No. 13/851,224, entitled, "System and Methods for Transmitting Data," filed Mar. 27, 2013 (now U.S. Pat. No. 9,160,495), which is a continuation of U.S. application Ser. No. 11/240,170, entitled, "Systems and Methods for Transmitting Data," filed Sep. 30, 2005, (now U.S. Pat. No. 8,428,185, issued on Apr. 23, 2013), which is a continuation of U.S. application Ser. No. 10/851,581, entitled, "Systems and Methods for Transmitting Data," filed May 21, 2004, (now U.S. Pat. No. 7,042,933, issued on May 9, 2006), which is a continuation of U.S. application Ser. No. 09/604,690, entitled, "Systems and Methods for Transmitting Data," filed Jun. 28, 2000, (now U.S. Pat. No. 6,850,559, issued Feb. 1, 2005), which claims the benefit of U.S. Provisional Application No. 60/141,321, entitled, "Transmission of Wide Band Data Across a Lossy Channel or Media," which was filed on Jun. 28, 1999, and all of the foregoing are hereby incorporated herein by reference in their entirety.

BACKGROUND OF THE INVENTION

1. Field of Invention

The present invention relates to transmission of data streams with time- or spatially dependent correlations, such as speech, audio, image, handwriting, or video data, across a lossy channel or media. More particularly, the present invention relates to the transmission of packets of multimedia data over a lossy channel.

2. Description of Related Art

When packets, or frames, of data are transmitted over a communication channel, for example, a wireless link, the Internet, or radio broadcast, some data packets may be corrupted, i.e., modified by the channel delayed so that they are not available when needed or altogether lost. Currently, when a data packet is corrupted, an error correction algorithm can be employed to provide replacement data to an output device in place of the corrupted data. Such error handling algorithms are particularly useful when the data packets are processed in real-time, since an output device will continue to output a signal, for example to loudspeakers in the case of audio, or video monitor in the case of video. The correction algorithm employed may be trivial, for example, repeating the last output sample or last output data packet or frame in place of the lost sample or packet or frame. Alternatively, the algorithm may be more complex, or non-trivial.

Three generally employed non-trivial techniques for providing replacement data are retransmission (RETX), error mitigation (EM) and forward error correction (FEC). Retransmission can be either automatic, i.e., built into the communication protocol, as with the transmission control protocol (TCP), or optional as in user datagram protocol (UDP). In the latter case, the decision to request a retransmission is left to the receiver.

Error mitigation relates to techniques for replacing corrupted data with interpolated data. In the case of audio signals, a trivial approach to mitigating errors has been to set all input bits to zero in an indicated corrupted sequence. This approach mutes the entire signal for the duration of the corrupted sequence since silence is preferable to loud pops and clicks. In the case of image signals, a number of image processing methods are known for interpolating the corrupted pixels. Error mitigation is sometimes known as error concealment.

Forward error correction is a set of redundancy techniques used to increase the probability that enough data will reach the receiver that the receiver will be able to re-construct the information data stream faithfully. Forward error correction, more particularly, relates to an error correction scheme using redundant codes that permits errors to be detected and corrected without requesting a retransmission from the transmitter. Several forward error correction codes are well known in the art, including block codes such as Hamming codes or Reed Solomon codes, and non-block codes such as convolutional codes.

It is well known that it is important to protect certain control bits, for example of an audio stream, such as the bits relating to volume control. This can be done by applying a higher rate of redundancy to control data than is used for other data in the same audio stream. This modulation of the level of protection depends on the importance and position of the specifically protected bits in the stream, and is known as unequal error protection.

A considerable amount of work has gone into techniques for dealing with packet corruption during multicast transmission. However, although various techniques have been used, each of these techniques requires additional bandwidth. Accordingly, there exists a need for providing the capability of reducing the amount of additional bandwidth required to communicate data streams over lossy channels while maintaining acceptable levels of degradation.

SUMMARY OF THE INVENTION

In some networks, especially wireless networks, channel capacity can be time-varying with a hard limit close to the bandwidth used by the coder-decoder. In this case, the retransmission of data packets which have incurred errors in the original transmission may increase the demand for network bandwidth beyond the network's capacity, and consequently cause further packet loss. In such cases, a technique for identifying those data packets which may be replaced by error mitigation techniques without incurring unacceptable signal degradation, would permit the receiver to keep the bandwidth within the capabilities of the network when errors occur. In addition, it is possible that the transmitter can make a determination not to send packets in the cases when the transmitter determines that the packets can be concealed adequately at the receiver.

Therefore, the exemplary embodiments of the present invention provide methods and systems that determine for which data packets a replacement method should include error mitigation (which does not consume any bandwidth) and for which data packets the replacement method should include other replacement methods, such as retransmission or forward error correction, both of which consume bandwidth.

Therefore, the replacement method will dynamically depend on a determination of the concealability of the corrupted packets, singly and multiply. In exemplary embodiments, the determination is made according to perceptual criteria, i.e., the result of the. determination depends on an estimate of the perceived quality of the signal after error mitigation techniques have been used to generate data to replace the packet(s) or frame(s). For example, retransmission or forward error correction are used more often when the risk is high that an end-user would still perceive signal degradation after mitigation. Alternatively, retransmission etc. would be used less often when this risk of end-user perception is low.

These and other features and advantages of the present invention are described in or are apparent from the following detailed description of the exemplary systems and methods according to the present invention.

BRIEF DESCRIPTION OF THE DRAWINGS

The present invention will be readily appreciated and understood from consideration of the following detailed description of exemplary embodiments of the present invention, when taken with the accompanying drawings, in which.

DETAILED DESCRIPTION

Figure 1:
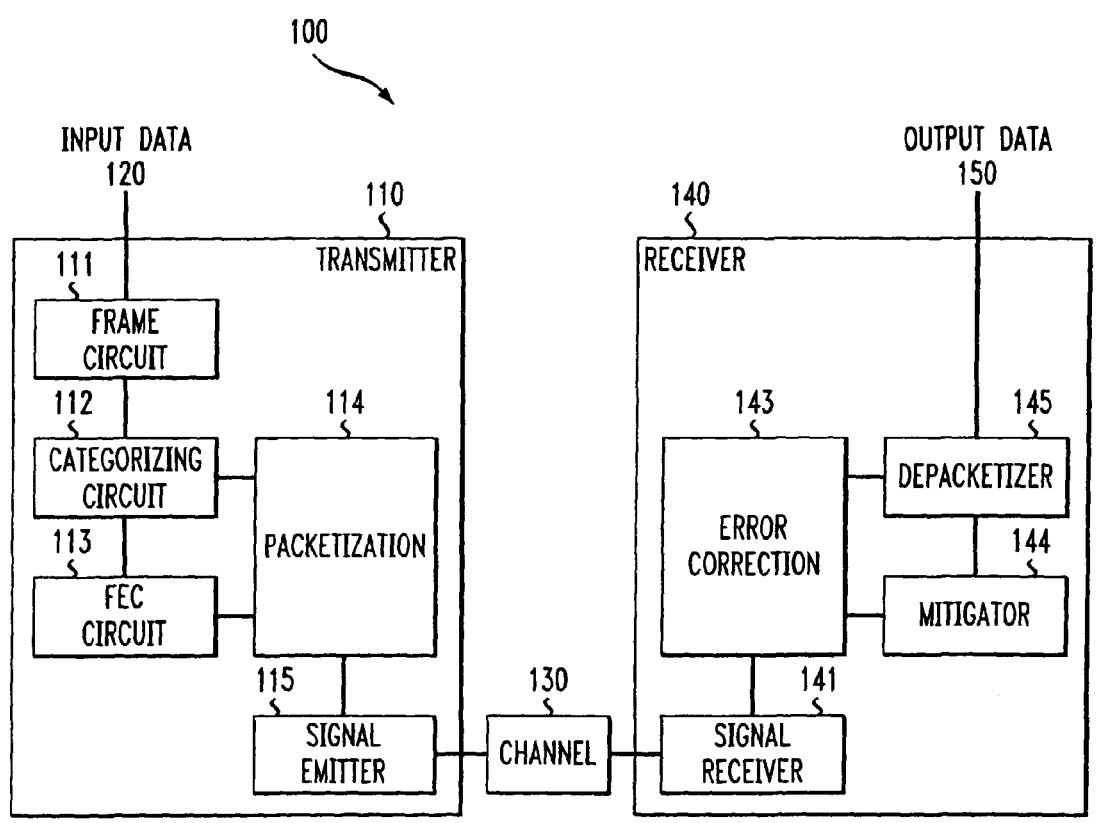
FIG. 1 is a schematic function diagram showing a transmission system according to a first exemplary embodiment of the present invention.

FIG. 1 shows an exemplary block diagram of a transmission system 100 according to the present invention. The transmission system 100 includes a transmitter unit 110 and a receiver unit 140. In operation, the transmitter unit 110 receives an input data stream from an input link 120 and transmits a signal over a lossy channel 130. The receiver unit 140 receives the signal from the lossy channel 130 and outputs an output data stream on an output link 150. It should be appreciated that the data stream could be any known or later developed kind of signal representing data. For example, the data stream may be any combination of data representing audio, video, graphics, tables and text.

The input link 120, the output link 150 and the lossy channel 130 can be any known or later developed device or system for connection and transfer of data, including a direct cable connection, a connection over a wide area network or a local area network, a connection over an intranet, a connection over the Internet, or a connection over any other distributed network or system. Further, it should be appreciated that the links 120 and 150 and the channel 130 can be a wired or a wireless link. It should also be appreciated that input link 120 and output link 150 may be analog connections, as might be the case for video processing: 120 would be a camera and 150 might be a VCR or TV receiver.

As shown in FIG. 1, the transmitter unit 110 includes a framing circuit 111, a categorizing circuit 112, a forward error correction circuit 113 (strictly speaking, a forward error protection circuit, since its function is to incorporate redundancy to protect against anticipated channel errors), a data packet building circuit 114 and a signal emitter 115.

The framing circuit 111 receives data from input link 120 and collects an amount of input data into a buffer to form a frame of input data.

The categorizing circuit 112 receives each frame of data from the framing circuit 111 and categorizes the data into at least two categories according to one or more criteria. For example, the categories can include the predictability of the data and/or the perceptual importance of the data. Furthermore, the categorizing data can be included with the data, or be disjoint from the data it categorizes. Either category may be derived in a number of ways.

The predictability of the data can be an estimate of the difference between the original data and the result of error mitigation of the data if the data were to be unavailable, for example, because of transmission loss or data corruption in the channel 130. For example, the higher the predictability of data, the smaller the difference between the data and the mitigated data. Accordingly, the data with a higher predictability could be associated with a lower category number (i.e., lower importance).

The perceptual importance of data can be an estimate of the perceived difference between the mitigated data and the uncorrupted data. For example, is an end-user of the data, such as a person listening to an audio playback of the data, going to notice that all or a portion of the data has been mitigated? The more likely the end-user is to notice the difference between the mitigated and actual data, the higher the category number (i.e., higher importance) of the data.

Preferably, the categorization of data packets is based on the effect on perceived degradation of the output when each data packet is replaced by data generated by error mitigation. That is, if a data packet that is filled in by error mitigation would cause significant degradation to the output (playback) quality, it is categorized as "more significant" (higher category number). If filling in a data packet with error mitigation causes little or no perceptible degradation, it is categorized as "less significant" (lower category number).

Additionally, it should be understood that categorizing the data packets can be based on any other techniques currently known. For example, the data packets may be categorized based on the perceptual entropy of the data to be replaced, the prediction gain available in the data to be replaced, the instantaneous bit rate of the data, a change in energy of a current frame compared to previous frames of the data, a temporal noise shaping (TNS) parameter, or a value of a pre-echo control parameter.

Detailed explanations of some of these techniques may be found in: [Add JJ Perceptual Entropy paper], J. Herre, and J. D. Johnston, "Enhancing the Performance of Audio Coders by using Temporal Noise Shaping (TNS)," in the proceeding of the 101.sup.st Convention of the Audio Engineering Society, November 1996, preprint 4384; and J. Herre and J. D. Johnston, "Exploiting Both Time and Frequency Structure in a System that uses an Analysis/Synthesis Filterbank with High Frequency Resolution," proceeding of the 103.sup.rd Convention of the Audio Engineering Society, September 1997, preprint 4519. Incorporated herein by reference in their entirety.

Additionally, it should be understood that there may be two or more categories for the data. In other words, the categorization circuit 112 may have varying levels of importance that the categorization circuit 112 can categorize data into. For example, there may exist four categorization levels that the data may be categorized into. Accordingly, data that is essential for reconstructing can be categorized into category 4. Data that is less essential to reconstructing, but, that is necessary for high quality reproduction can be categorized into category 3. Similarly, data that will only minorly effect/degrade the quality of the output signal, if it is corrupted, can be categorized into category 2. Finally, data that will not effect the quality of the output signal if corrupted, such as redundant data, may be categorized into category 1.

As described above, categorization performed by the categorizing circuit 112, allows a determination of which data packets, when corrupted, should be filled in by error mitigation and which data packets should be protected with forward error correction prior to transmission. Error mitigation is used to handle corrupted data packets when the resulting level of degradation is acceptable, thereby saving bandwidth on the channel. Alternatively, forward error correction can be used only when necessary, such as when the level of degradation resulting from corrupt data would be unacceptable.

Based on the categorization of the data, the categorizing circuit 112 can transmit the data to the forward error correction circuit 113 or directly to the packetization circuit 114. If the data is transmitted to the forward error correction circuit 113, the forward error correction circuit 113 calculates error correction data for the original data, and can then transmit the original data and the error correction data to the packetization circuit 114. The error correction data can be prepared in accordance with any known or later developed technique of error correction without departing from the spirit and scope the present invention.

It should be understood, that the categorization circuit 112 can include categorization data for only a portion of the data to be transmitted, such as high priority data. In this manner, the data can be assumed to be low priority unless it has a high priority categorization. Therefore, because in many systems the high priority data tends to be less frequent than the low priority data, bandwidth can be used more efficiently.

Figure 7:
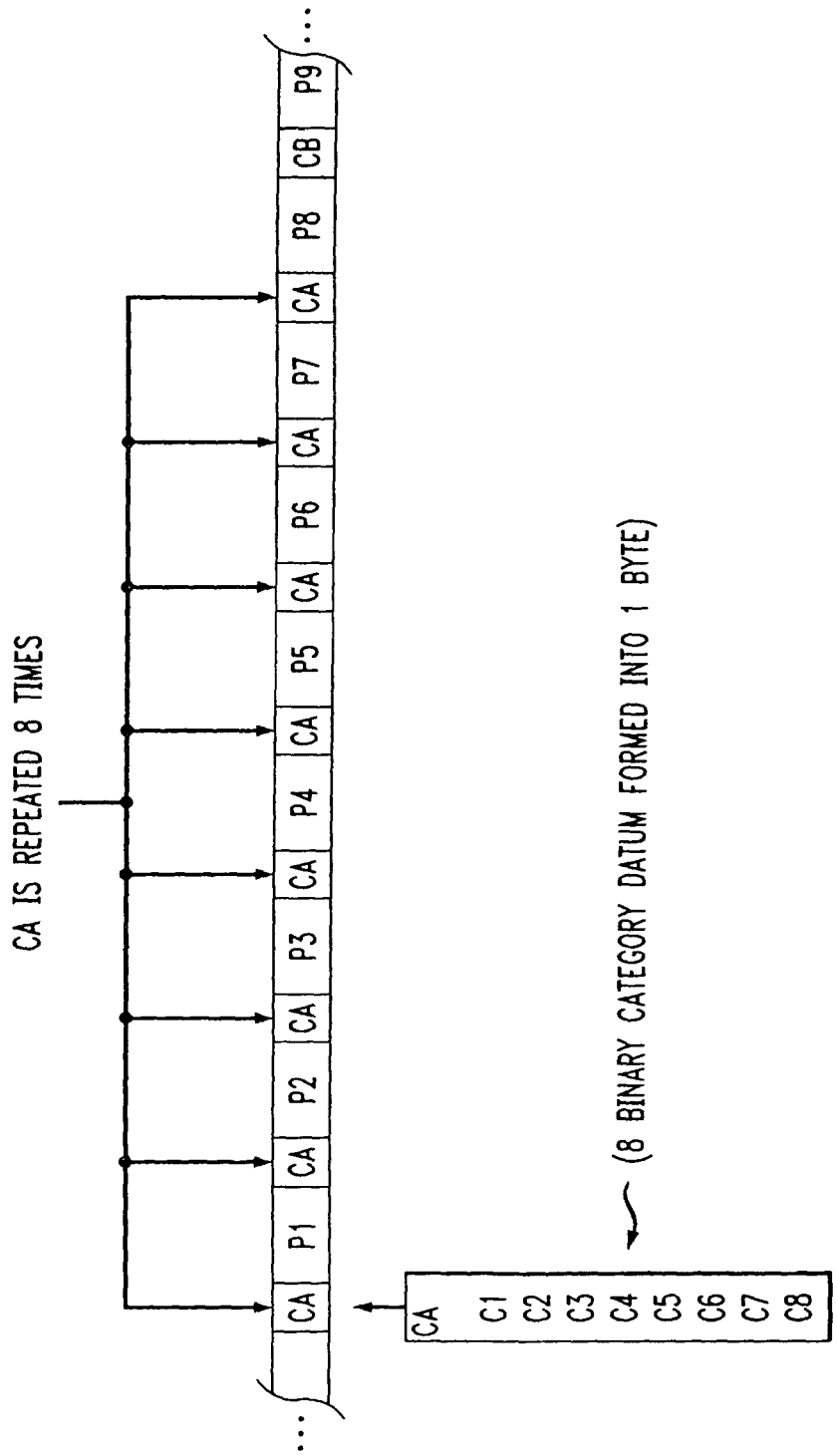
FIG. 7 is a diagram of an example of a transmitted bit stream in accordance with the second exemplary embodiment of the present invention.

The packetization circuit 114 builds packets, or frames, of the data, error correction data and/or categorizing data. Preferably, the data and the associated categorizing data are transmitted with both redundancy and time diversity. For example, as shown in FIG. 7, the binary categorizing data for eight data packets are assembled into a byte of categorizing data. This byte which represents the categories for eight successive data packets is transmitted with each of these eight data packets. A specific field of each data packet may be used for transmitting this byte. It will be appreciated by those skilled in the art that the categorizing data may be multilevel, and may be accumulated for transmission into groups of greater or lesser than 8 packets. It will further be appreciated that the category grouping may assemble interleaved packets (to improve time diversity). It will further be appreciated that the packets represented by successive category bytes may be the same for some number of packets, may be entirely disjoint, or may overlap to a greater or lesser extent. For example, each category grouping may contain the category information for the previous (or future) 8 packets.

The signal emitter 115 receives the data from the packetization circuit 114 and transmits the data packets together with any error correction/detection data provided by the forward error correction circuit 113 over the lossy channel 130 to the receiver 140.

The receiver unit 140 includes a signal receiver 141, an error correction circuit 143, an error mitigation circuit 144 and a depacketizer 145. The signal receiver 141 receives signals from the lossy channel 130 and transmits the received data to the error correction circuit 143.

The error correction circuit 143 detects certain types of transmission errors occurring during the transmission over the lossy channel 130. Transmission errors can include any distortion or loss of the data between the time the data is input into the transmitter, until it is needed by the receiver for processing into an output stream or for storage. Transmission errors are also considered to occur when the data is not received by the time that the output data is required for output link 150. When none of the data is corrupted in a packet, the data packet is transmitted to the depacketizer 145. If a transmission error has occurred, the error correction circuit 143 can examine the data to determine how the data has been characterized by the categorization circuit 112 of the transmitter 110. If the data has been categorized as requiring the use of forward error correction in order to exactly reproduced the original signal, then the error correction circuit 143 can use any forward error correction data included in the data stream to correct the corrupted data. Alternately, if the corrupted data packet does not require exact reproduction, or if the corruption remains in a corrupted data packet even after error correction, the error correction circuit 143 can transmit the data packet to the mitigator circuit 144 for correction.

The error mitigation circuit 144 mitigates the remaining transmission errors according to any known or later developed error mitigation technique. Once the mitigation circuit 144 has completed its task, the error mitigation circuit 144 transmits the resulting data packet to the depacketizer 145.

It should be appreciated that data packets of the higher category number will often be assigned more error correction data than data packets of the lower category, in which case it will be possible to correct more corrupted data of the higher category number than corrupted data of the lower category. Additionally, if such data replacement is not sufficient for recovering the corrupted data, any remaining corrupt data may be replaced by error mitigation.

Figure 2:
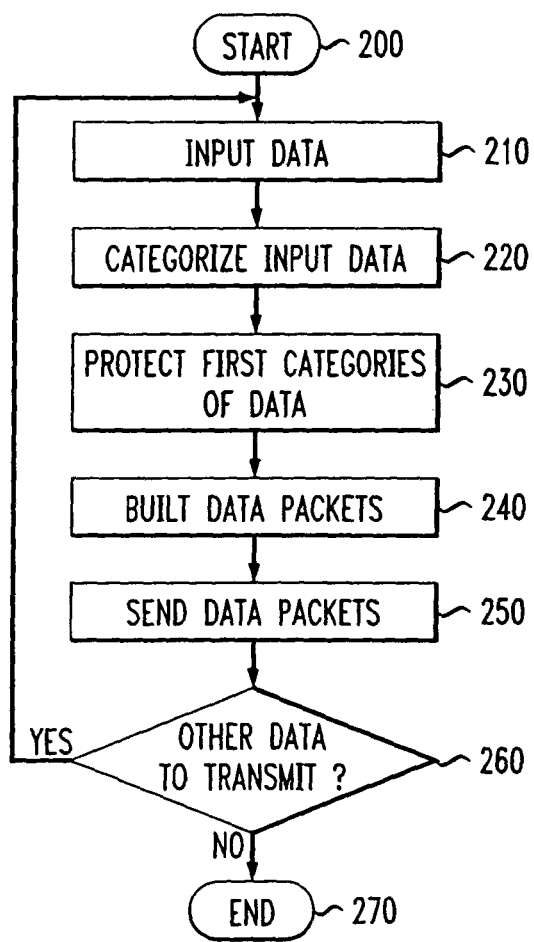
FIG. 2 is a flowchart outlining a transmission method in accordance with the first exemplary embodiment of the present invention.

FIG. 2 is a flowchart outlining an exemplary transmission method in accordance with the present invention. The process begins in step 200, and control continues to step 210, in which data to be transmitted is input.

Next, in step 220, the input data is categorized into at least two categories according to one or more criteria. For example, the categories can include the predictability of the data and/or the perceptual importance of the data.

As described above, either category may be derived in a number of ways. The predictability of the data can be an estimate of the difference between the data and the result of error mitigation of the data if the received data were to be unavailable, for example, because of transmission loss or data corruption in the channel. The higher the predictability, the smaller the difference between the data and the mitigated data, the lower the category number (lower importance) of the data. The perceptual importance of a data can be an estimate of the perceived difference between the mitigated data and the corrupted data. The higher the perceived difference, the higher the category number (higher importance) of the data.

Preferably, categorizing data packets is based on the effect on perceived degradation of the output when each data packet is replaced by data generated by error mitigation. That is, if a data packet that is filled in by error mitigation would cause significant degradation to the output quality, it is categorized as "more significant" (higher category number). If filling in a data packet with error mitigation causes little or no perceptible degradation, it is categorized as "less significant" (lower category number).

The categorization performed in step 220 allows determination of which data packets, when corrupted, should be filled in by error mitigation and which should be protected with forward error correction prior to transmission, such as in the case of a broadcast transmission when retransmission is not possible. Error mitigation is used to handle corrupted data packets when the resulting level of degradation is acceptable thereby saving bandwidth on the channel, and forward error correction is used only when necessary.

Control then continues to step 230 in which error correction data is calculated for the data of higher category number (greater importance). The error correction data can be prepared in accordance with any known or later developed kind of error correction scheme. Next, in step 240, data packets are built with the input data. The data packets are packets, or frames, of data, error correction data and categorizing data. Preferentially, the categorizing data are sent in two or more data packets for purposes of time diversity. For example, if the categorization circuit generates binary (i.e., high/low categories), then the binary categorizing data for eight data packets could be used to generate a byte of data. This byte representing the categories for eight successive data packets would be transmitted with each of these eight data packets. A specific field of each data packet may be used for transmitting this byte. As described above, the grouping of category data can be accomplished many ways without departing from the spirit and scope of the present invention.

Next, in step 250, the data packets are transmitted over a channel, together with error correction/detection data for each packet. The error correction/detection data is independent from the packet categorization data included in the data packets. Next, in step 260, a determination is made whether other data are to be input. If so, control jumps back to step 210; otherwise, control continues to step 270 in which the process ends.

Figure 3:
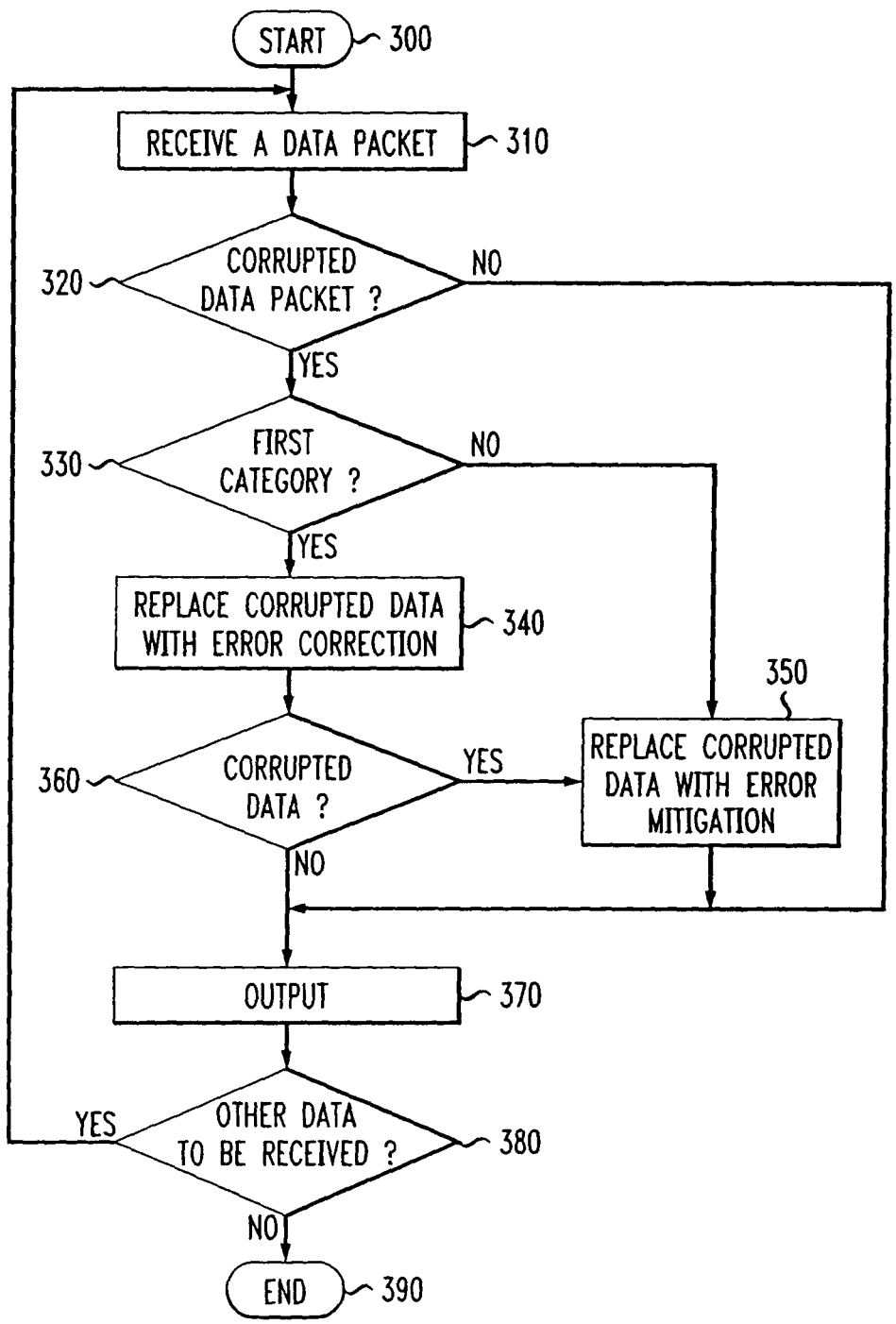
FIG. 3 is a flowchart outlining a reception method in accordance with the first exemplary embodiment of the present invention.

FIG. 3 is a flowchart outlining an exemplary reception method in accordance with the present invention. Beginning in step 300, control continues to step 310 in which a data packet is received from a channel. Next, in step 320, a determination is made whether the data packet is corrupted. If so, control continues to step 330; otherwise control jumps to step 370.

In step 330, a determination is made whether the data packet is of higher category number (greater importance). If so, control continues to step 340. Otherwise, control continues to step 350.

In step 340, the corrupted data of the corrupted data packet is corrected by the forward error correction circuitry. Control then jumps to step 360, in which a determination is made whether corrupted data remains in the corrected data packet. If so, control continues to step 350; otherwise, control continues to step 370. In step 350, the corrupted data of the corrupted data packet is replaced with error mitigation. Control then continues to step 370.

In step 370, the data is organized and outputted. Next, in step 380, a determination is made whether another data packet is to be received. If so, control jumps back to step 310 and the process is repeated; otherwise, control continues to step 390 where the process ends.

It should be appreciated that data packets of the higher category will often be assigned more error correction data than data packets of the lower category, in which case it will be possible to correct more corrupted data of the higher category than corrupted data of the lower category, by correcting errors in the transmitted data packets. Additionally, if such data replacement is not sufficient for recovering the corrupted data, the corrupted data may be replaced by error mitigation.

In an alternative exemplary embodiment of the transmission systems and methods of the present invention, no variable error correction is used, e.g., the receiver unit employs either error mitigation or retransmission to replace corrupted data packets.

Figure 4:
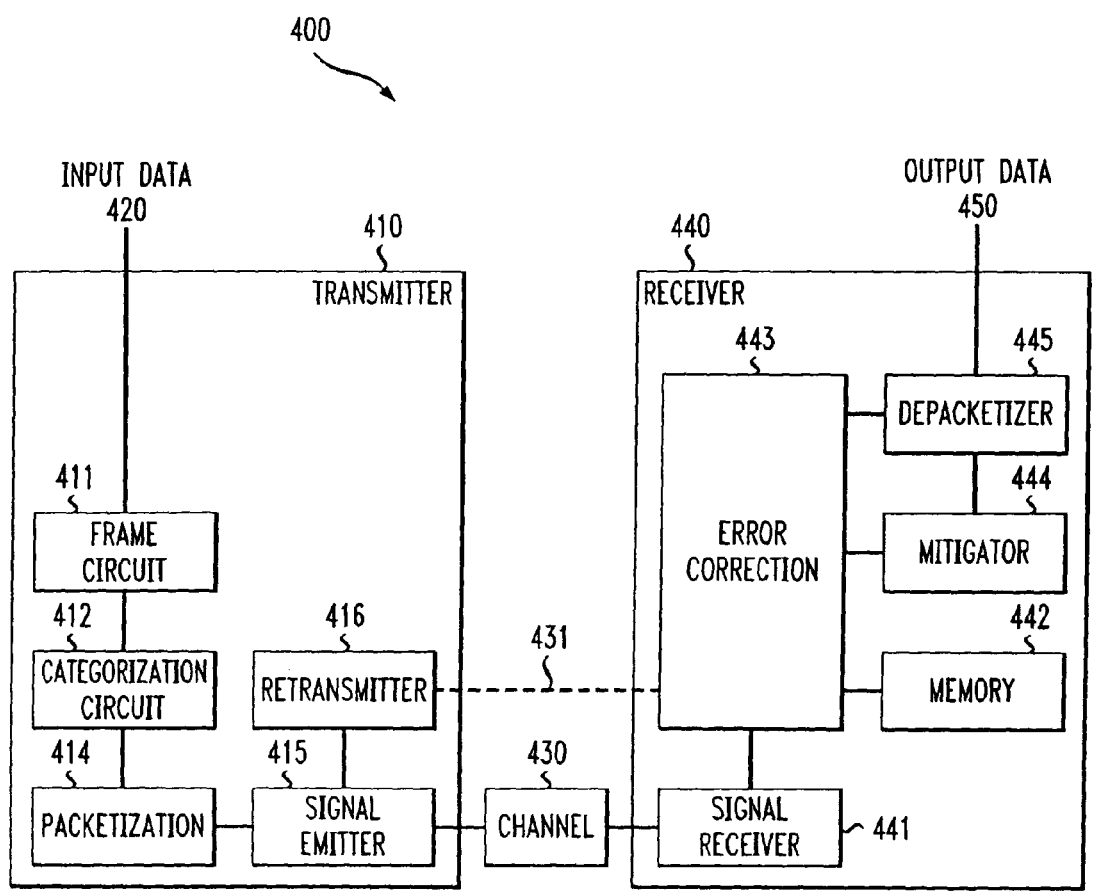
FIG. 4 is a schematic function diagram showing a transmission system according to a second exemplary embodiment of the present invention.

FIG. 4 is an exemplary block diagram showing an alternative embodiment of a transmission system 400 according to the present invention. As shown in FIG. 4, the transmission system 400 includes a transmitter unit 410 and a receiver unit 440. The transmitter unit 410 receives an input data stream from an input link 420 and transmits a signal over a lossy channel 430. The receiver unit 440 receives the signal from the lossy channel 430 and outputs an output data stream on an output link 450.

As described above, it should be appreciated that the data stream could be any known or later developed kind of signal representing data. For example, the data stream may be any combination of data representing speech, audio, video, still images, graphics, tables, handwriting, and text.

The input link 420, the output link 450 and the lossy channel 430 can be any known or later developed device or system for connection and transmission of data, including a direct cable connection, a connection over a wide area network or a local area network, a connection over an intranet, a connection over the Internet, or a connection over any other distributed network or system. Further, it should be appreciated that the links 420 and 450 and the channel 430 can be a wired or a wireless link to a network, and that links 420 and 450 can be either analog or digital links.

The transmitter unit 410 includes a framing circuit 411, a categorizing circuit 412, a packetization circuit 414, a retransmitting circuit 416 and a signal emitter circuit 415. As described with reference to the framing circuit 111 in FIG. 1, framing circuit 411 receives data from input link 420 and collects an amount of input data into a buffer to form a frame of input data.

The categorizing circuit 412 receives the data from the framing circuit 411 and categorizes the data into at least two categories according to one or more criteria. Furthermore, the categorizing data can be included with the data, or be disjoint from the data it categorizes. For example, the categories can include the predictability of the data and/or the perceptual importance of the data. As described above, either category may be derived in a number of ways. Furthermore, as described above, numerous categories can be defined for the data.

It should be understood, that the categorization circuit 412 can include categorization data for only a portion of the data to be transmitted, such as high priority data. In this manner, the data can be assumed to be low priority unless it has a high priority categorization. Therefore, because in many systems the high priority data tends to be less frequent than the low priority data, bandwidth can be used more efficiently.

The packetization circuit 414 can receive the data and any categorization data from the categorizing circuit 412. The packetization circuit then builds packets, or frames, of the data and categorizing data. Preferably, the data and the associated categorizing data are transmitted in a manner having both redundancy and time diversity in accordance with any technique well known in the art.

The signal emitter 415 receives the data from the packetization circuit 414 and transmits the data packets over the lossy channel 430 to the receiver 440.

As shown in FIG. 4, the retransmission circuit 416 is connected to the receiver 440 via the channel 431. The retransmission circuit 416 monitors the channel 431 for a request for retransmission from the receiver 440. A request for retransmission can include an indication of a particular portion of data that should be retransmitted by the transmitter 410. In response to receiving the request for retransmission the retransmitting circuit 416 instructs the signal emitter 415 to retransmit the particular portion of data. While shown as a separate channel, the channel 431 can be included in the lossy channel 430 or can be a separate communication line between the transmitter 410 and the receiver 440.

The receiver unit 440 includes a signal receiver 441, a memory 442, an error correction circuit 443, an error mitigation circuit 444, and a signal depacketizer 445. Incoming signals are received from the channel 430 by the signal receiver 441. The data signal is then transmitted to the error correction circuit 443.

The error correction circuit 443 analyzes the signal to detect transmission errors that occur during the transmission over the lossy channel 430. When no transmission error has occurred, the data packets are transmitted to the signal depacketizer 445, and subsequently output. If a transmission error has occurred, the error correction circuit 443 can examine the data to determine how the data has been previously characterized by the categorization circuit 412 of the transmitter 410. If the data has been categorized as having a high level of importance (i.e., the data must be accurately reconstructed), then the error correction circuit 443 can transmit a retransmission request to the retransmission circuit 416 over channel 431 to have the transmitter 410 retransmit the data. Alternatively, if the corrupted data packet has a low level of importance (i.e., accurate reproduction is not required to maintain a certain quality of reproduction), then the error correction circuit 443 can transmit the data packet to the mitigation circuit 444 for correction.

The error mitigation circuit 444 mitigates the remaining transmission error according to any known or later developed error mitigation technique. Once the mitigation circuit 444 is complete, the error mitigation circuit 444 transmits the resulting data packets to the signal decoder 145.

In a variation of this exemplary embodiment, the receiver will supplement categorizing information transmitted from the transmitter unit 410 to the receiver unit 440. In this variation, the categorizing circuit 443 of the receiver unit 440 re-categorizes each corrupted data packet using the position of the data packet in a succession of corrupted data packets together with the category information sent by the transmitter. Additionally, the error correction circuit 443 can communicate information regarding the errors contained in the incoming signal to the memory 442 to compile a running history of error occurrence. This instantaneously adjusted history data can then be used by the error correction circuit 443 to dynamically adjust the category or importance of incoming data packets, and thereby dynamically control the number of requests for retransmissions sent to the transmitter 410.

For example, assume that three data packets are sequentially transmitted across the channel 430, and that all three of the data packets are categorized as having a low importance (i.e., retransmission is not required to reconstruct the data packets if they are corrupted). If the first two data packets are received and determined to be corrupt and require mitigation, then the error correction circuit 443 can ascertain data loss prior to the first two data packets from the history stored in memory 442. Depending on the history of loss, the error correction circuit 443 can dynamically increase or promote the importance of the third data packet from the original low importance to a higher importance. In other words, the error correction circuit 443 can dynamically change the categorization of a data packet based on the state (corrupt/non-corrupt) of the previously received data packets. By doing so, if the third data packet is then found to be corrupt, then the error correction circuit 443 can request a retransmission from the transmitter 410, as described above.

The dynamic promotion of the data packets based on the history of error occurrence can improve the performance of error loss handling in the case of loss of consecutive data packets which individually may not be very important, but, when a series of them are lost or corrupted, error mitigation alone would be insufficient to achieve desired levels of performance.

In a further variation the transmitter 410 does not categorize data packets, or the category data is lost in the channel in which case the decision between mitigation and retransmission is made by the receiver 440 based entirely on the recent history of packet corruption and on other characteristics of the data stream that the receiver 440 is able to deduce from the data stream.

It will be appreciated by one skilled in the art that in this exemplary embodiment, the error correction circuit 443 can also take into consideration available channel 430 capacity when making a determination as to whether to request a retransmission from the transmitter 410. For example, if the channel 430 capacity is high, then the error correction circuit 443 can request a retransmission for all or most of the corrupted data packets since the available bandwidth is ample. However, if the capacity of channel 430 is low, or non-existent, the error correction circuit 443 can refrain from requesting any retransmissions from the transmitter 410, except for the most critical cases. By shifting a threshold requirement for the request for retransmission based on the capacity of the channel 430, the error correction circuit 443 can maximize the quality of the output signal while simultaneously not overburdening the capacity of the channel 430.

It should be appreciated that because corrupted data packets of the higher category will usually be retransmitted and not data packets of the lower category, more packets of the higher category will (eventually) be received correctly than data packets of the lower category. Additionally, if such data retransmission is not sufficient for recovering the corrupted data, the corrupted data may be replaced by error mitigation.

In an alternative embodiment, the transmitter 410 can only transmit a subset of the data based on the availability of bandwidth or congestion on the channel 430. The determination of whether to transmit can be based on the category of the data. For example, if a large amount of bandwidth is available, then the transmitter 410 can transmit all categories of data, such as both high and low priority data. However, if the bandwidth becomes less available, the transmitter can make a determination to only transmit high priority data while dropping any lower priority data until the amount of available bandwidth increases.

Figure 5:
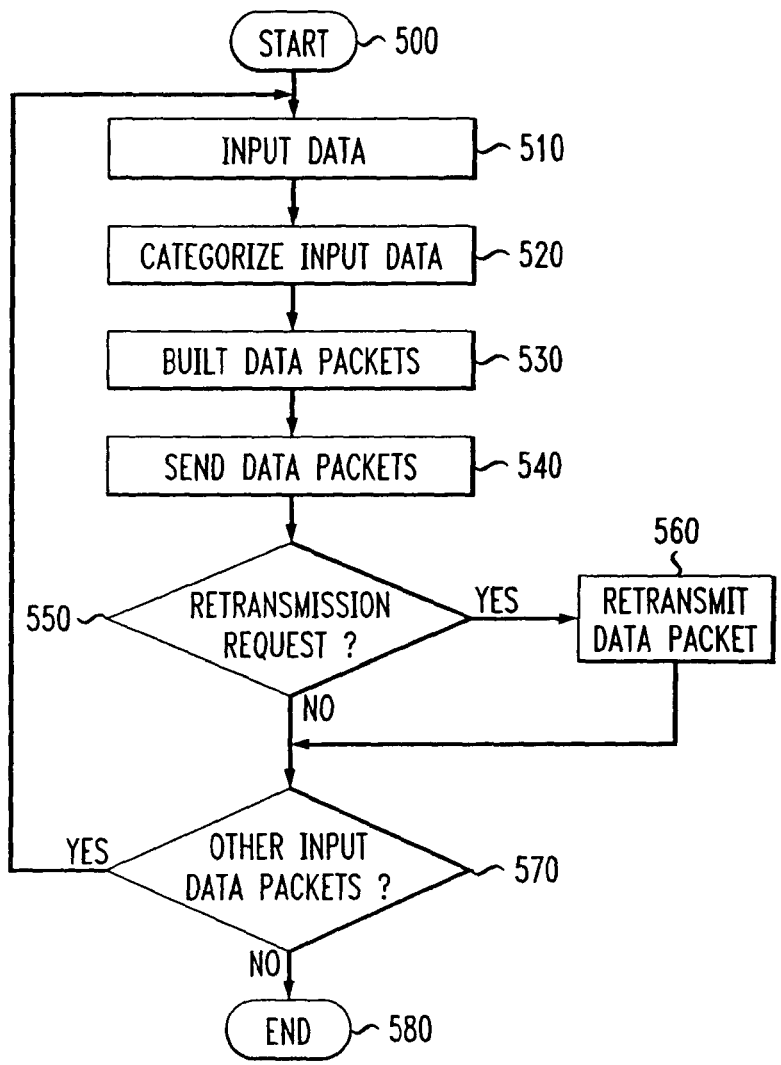
FIG. 5 is a flowchart outlining a transmission method in accordance with the second exemplary embodiment of the present invention.

It should be understood that while the embodiments have been explained separately for clarity, using either forward error correction or retransmission but not both together, either embodiment or portion thereof can be used in conjunction with the other without departing from the spirit or scope of the present invention FIG. 5 is a flowchart outlining an exemplary transmission method in accordance with the present invention. Beginning in step 500, control continues to step 510, in which data to be transmitted is input.

Next, in step 520, the input data is categorized into at least two categories according to one or more criteria. For example, the categories can include the predictability of the data and/or the perceptual importance of the data. Either category may be derived in a number of ways.

The categorization performed in step 520, which may be either binary or multi-level, allows determination of which data packets, when corrupted or lost, should be filled in by error mitigation and which should be protected with retransmission. Error mitigation is used to handle corrupted data packets when the resulting level of degradation is acceptable thereby saving bandwidth on the channel, and retransmission is used only when necessary.

Control then continues to step 530, in which data packets are built with the input data. The data packets are packets, or frames, of data and categorizing data. Preferentially, the categorizing data are sent in two or more data packets. For example, the binary categorizing data for eight data packets are used to generate a byte. This byte that represents the categories for eight successive data packets is transmitted with each of these eight data packets. A specific field of each data packet may be used for transmitting this byte.

Next, in step 540, the data packets are transmitted over a channel, together with transport error correction/detection data for each packet. The transport error correction/detection data is independent from the packet categorization data, which may be included in the data packets or transmitted separately.

Control then passes to step 550. A determination is made whether a retransmission of any data packet is requested. If so, control continues to step 560.

Otherwise, control jumps to step 570. In step 560, a retransmission of the requested data packet is made. Control then continues to step 570. In step 570, a determination is made whether other data are to be input. If so, control jumps back to step 510. Otherwise, control continues to step 580 where the process ends.

Figure 6:
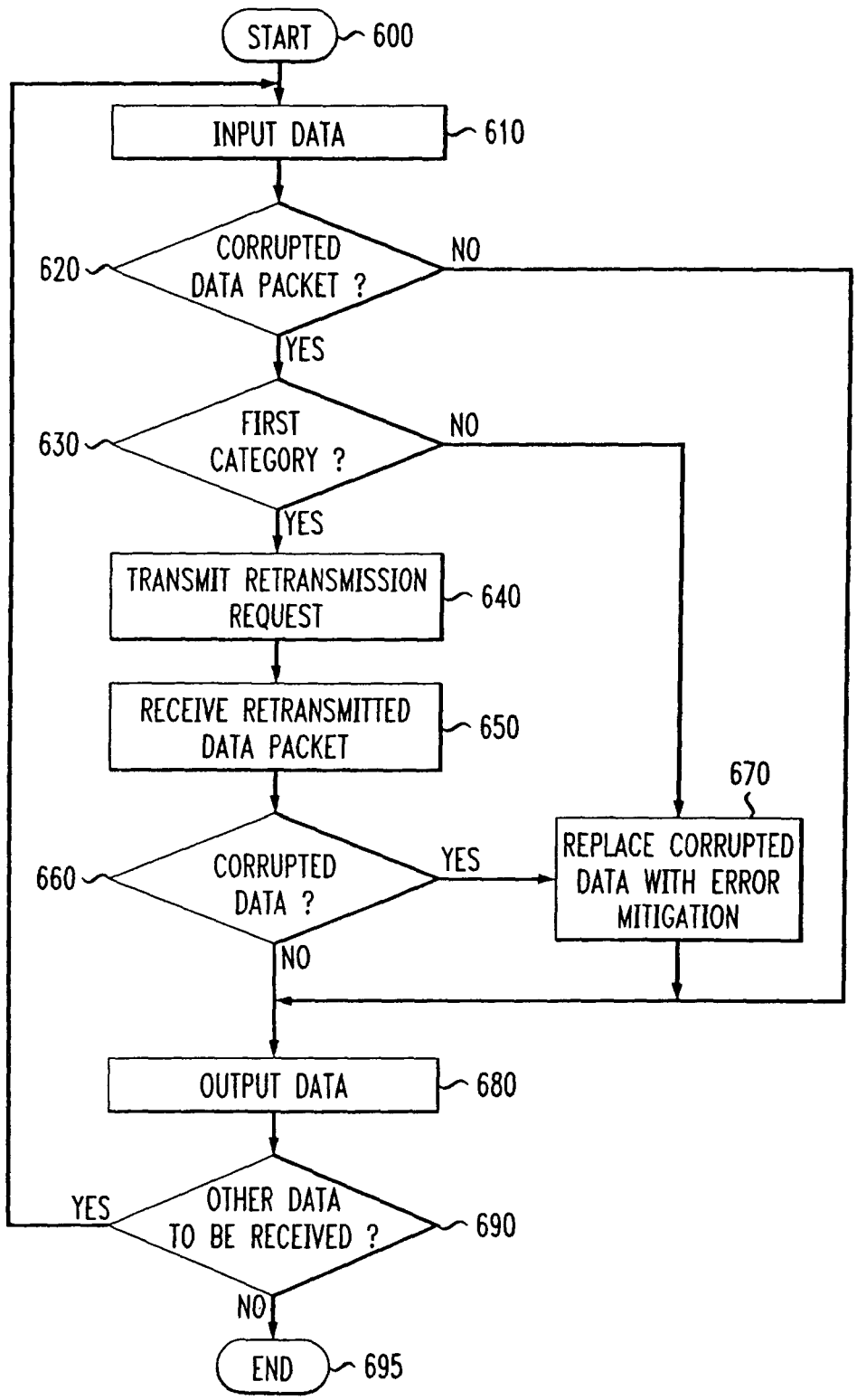
FIG. 6 is a flowchart outlining a reception method in accordance with the second exemplary embodiment of the present invention.

FIG. 6 is a flowchart outlining an exemplary reception method in accordance with the present invention. Beginning in step 600, control continues to step 610 where a data packet is received and transport errors are corrected if the data packet incorporates transport error correction data. Next, in step 620, a determination is made whether the data packet is corrupted. If so, control continues to step 630; otherwise control jumps to step 680.

In step 630, a determination is made whether the data packet is of higher category number (greater importance). If so, control continues to step 640. Otherwise, control jumps to step 670. In step 640, a retransmission request is sent back to a transmitter unit. Next, in step 650, a retransmitted data packet is received.

Next, in step 660, a determination is made whether the retransmitted data packet is corrupted. If so, control continues to step 670. (note that when a retransmitted packet is not received in time to provide data to a real-time output process 680, then effectively the retransmitted packet is considered lost or corrupt.) Otherwise control jumps to step 690. In step 670, the corrupted data of the corrupted data packet is replaced with error mitigation. Control then continues to step 680 in which the data is organized and outputted. Next, in step 690, a determination is made whether another data packet is to be received. If so, control jumps back to step 610. Otherwise, control continues to step 695 in which the process ends.

It should be appreciated that because data packets of the higher category will more often be retransmitted and not data packets of the lower category, it is possible to correct more corrupted data of the higher category than corrupted data of the lower category, by retransmitting data packets. Additionally, if such data retransmission is not sufficient for recovering the corrupted data, the corrupted data may be replaced by error mitigation.

The transmitter unit and the receiver unit may be, in the exemplary embodiments of the present invention shown in FIGS. 1-7, a microprocessor that uses software to implement exemplary embodiments of the methods and devices according to the present invention.

However, transmitter unit and/or the receiver unit can also be implemented on a special purpose computer, a programmed microcontroller and peripheral integrated circuit elements, an ASIC or other integrated circuit, a digital signal processor, a hardwire electronic or logic circuit such as a discrete element circuit, a programmable logic device such as a PLD, PLA, FPGA or PAL, or the like. Moreover, any device, capable of implementing a finite state machine that is in turn capable of implementing the flowcharts shown in FIG. 2, 3, 5, 6 or 7, can be used to implement the transmitter or receiver units.

Additionally, the communication networks and network services managed by the exemplary embodiments of the present invention are not limited to those expressly identified above. The exemplary embodiments of the present invention may be used to manage any type of now known or future developed communication system or network and communication service.

While the present invention has been described in conjunction with the exemplary embodiments outlined above, it is evident that many alternatives, modifications and variations will be apparent to those skilled in the art. Accordingly, the exemplary embodiments of the present invention, as set forth above, are intended to be illustrative, not limiting. Various changes may be made without departing from the spirit and scope of the present invention.

What is claimed is:

1. A method to correct corrupt media data at a wireless device, the method comprising:
    determining, at the wireless device, whether the corrupt media data is associated with a first level of risk of causing perceivable degradation to an output signal generated by the wireless device or a second level of risk, wherein the first level of risk is higher than the second level of risk;
    if the corrupt media data is determined to be associated with the first level of risk, correcting the corrupt media data with error correction data received at the wireless device; and
    if the corrupt media data is determined to be associated with the second level of risk, correcting the corrupt media data with interpolated data generated at the wireless device; wherein the correcting of the corrupt media data with the error correction data includes:
    determining whether the error correction data has been received; and
    when the error correction data has not been received, performing at least one of correcting the corrupt media data with the interpolated data generated at the wireless device, or requesting transmission of an uncorrupt version of the corrupt media data.

2. The method of claim 1, wherein the requesting of the transmission of the uncorrupt version of the corrupt media data is based on whether an amount of available bandwidth on a communication channel satisfies a threshold.

3. The method of claim 1, wherein the corrupt media data is determined to be associated with the second level of risk and the corrupt media data is included in a current data packet, the method further comprising:
   prior to the correcting of the corrupt media data, examining a history of error occurrence identifying a number of errors detected in a plurality of data packets received at the wireless device before the current data packet; and
   based on the history of the error occurrence, determining the corrupt media data is to be associated with the second level of risk.

4. The method of claim 1, wherein the determining of whether the corrupt media data is associated with the first level of risk of causing perceivable degradation to an output signal generated by the wireless device or the second level of risk is based on categorization data received with the corrupt media data at the wireless device.

5. The method of claim 4, wherein the categorization data indicates whether the corrupt media data is assigned to a first category or a second category, media data assigned to the first category having a higher risk of causing perceivable degradation to an output signal generated by the wireless device than media data assigned to the second category.

6. A non-transitory computer readable storage medium comprising computer readable instructions which, when executed by a computer, causes the computer to:
   determine whether corrupt media data received at a wireless device is associated with a first level of risk of causing perceivable degradation to an output signal generated by the wireless device or a second level of risk, wherein the first level of risk is higher than the second level of risk;
   when the corrupt media data is determined to be associated with the first level of risk, correct the corrupt media data with error correction data received at the wireless device; and
   when the corrupt media data is determined to be associated with the second level of risk, correct the corrupt media data with interpolated data generated at the wireless device;
   wherein correction of the corrupt media data with the error correction data, includes:
   determine whether the error correction data has been received at the wireless device; and
   when the error correction data has not been received at the wireless device, perform at least one of correct the corrupt media data with interpolated data generated at the wireless device, or request transmission of an uncorrupt version of the corrupt media data.

7. The non-transitory computer readable storage medium of claim 6, wherein the request for transmission of the uncorrupt version of the corrupt media data is based on whether an amount of available bandwidth on a communication channel satisfies a threshold.

8. The non-transitory computer readable storage medium of claim 6, wherein the corrupt media data is determined to be associated with the second level of risk and the corrupt media data is included in a current data packet, the operations further comprising:
   prior to the correction of the corrupt media data, examine a history of error occurrence identifying a number of errors detected in a plurality of data packets received at the wireless device before the current data packet; and
   based on the history of the error occurrence, determine the corrupt media data is to be associated with the second level of risk.

9. The non-transitory computer readable storage medium of claim 6, wherein whether the corrupt media data is associated with the first level of risk of causing perceivable degradation to an output signal generated by the wireless device or a second level of risk is determined based on categorization data received with the corrupt media data at the wireless device.

10. The non-transitory computer readable storage medium of claim 9, wherein the categorization data indicates the corrupt media data is assigned to one of a first category and a second category, corrupt media data assigned to the first category having a higher risk of causing perceivable degradation to an output signal generated by the wireless device than corrupt media data assigned to the second category.

11. A wireless device to correct corrupt media data received via a communication channel, the wireless device comprising:
   a memory including machine readable instructions; and a processor to execute the instructions to perform operations including:
   determine whether the corrupt media data is associated with a first level of risk of causing perceivable degradation to an output signal generated by the wireless device or a second level of risk, wherein the first level of risk is higher than the second level of risk;
   when the corrupt media data is determined to be associated with the first level of risk, correct the corrupt media data with error correction data received at the wireless device; and
   when the corrupt media data is determined to be associated with the second level of risk, correct the corrupt media data with interpolated data generated at the wireless device,
   wherein the correction of the corrupt media data with the error correction data includes:
   determine whether the error correction data has been received; and
   when the error correction data has not been received, at least one of correct the corrupt media data with interpolated data generated at the wireless device, or request transmission of an uncorrupt version of the corrupt media data.

12. The wireless device of claim 11, wherein the request for transmission of the uncorrupt version of the corrupt media data is based on whether an amount of available bandwidth on the communication channel satisfies a threshold.

13. The wireless device of claim 11, wherein the corrupt media data is determined to be associated with the second level of risk and the corrupt media data is included in a current data packet, the operations further including:
   prior to the correcting of the corrupt media data, examine a history of error occurrence identifying a number of errors detected in a plurality of data packets received at the wireless device before the current data packet; and
   based on the history of the error occurrence, determine the corrupt media data is to be associated with the second level of risk.

14. The wireless device of claim 11, wherein the operation to determine whether the corrupt media data is associated with the first level of risk of causing perceivable degradation to an output signal generated by the wireless device or the second level of risk is based on categorization data received with the corrupt media data at the wireless device, the categorization data indicating whether the corrupt media data is assigned to one of a first category and a second category.

* * * * *